United States Patent [19]

Wu

[11] 4,161,038

[45] Jul. 10, 1979

[54] COMPLEMENTARY METAL-FERROELECTRIC SEMICONDUCTOR TRANSISTOR STRUCTURE AND A MATRIX OF SUCH TRANSISTOR STRUCTURE FOR PERFORMING A COMPARISON

[75] Inventor: Shu-Yau Wu, Pittsburgh, Pa.

[73] Assignee: Westinghouse Electric Corp., Pittsburgh, Pa.

[21] Appl. No.: 834,941

[22] Filed: Sep. 20, 1977

[51] Int. Cl.² .................. G11C 11/40; G06G 7/00
[52] U.S. Cl. .................... 365/145; 307/288; 340/149 R; 365/181; 365/184
[58] Field of Search ............ 365/145, 181, 184, 49; 340/149 R; 364/808; 307/288

[56] References Cited

U.S. PATENT DOCUMENTS

| | | | |
|---|---|---|---|
| 3,832,700 | 8/1974 | Wu et al. | 365/145 |
| 4,053,798 | 10/1977 | Koike et al. | 365/181 |
| 4,063,225 | 12/1977 | Stewart | 365/188 |

Primary Examiner—Stuart N. Hecker
Attorney, Agent, or Firm—H. W. Patterson

[57] ABSTRACT

A complementary metal-ferroelectric-semiconductor transistor structure (MFST) in which an n-channel MFST is electrically coupled to a p-channel MFST in complementary fashion with the source of the n-channel MFST connected to the drain of the p-channel MFST and the drain of the n-channel MFST connected to the source of the p-channel MFST. The memory element is controlled in response to a polarizing voltage, and erasing voltage, a reference signal, and input signals such that the input signals are compared with respect to the reference signal. A matrix of memory elements arranged in rows and columns is also described with each of the memory elements comprised of a complementary MFST structure.

13 Claims, 6 Drawing Figures

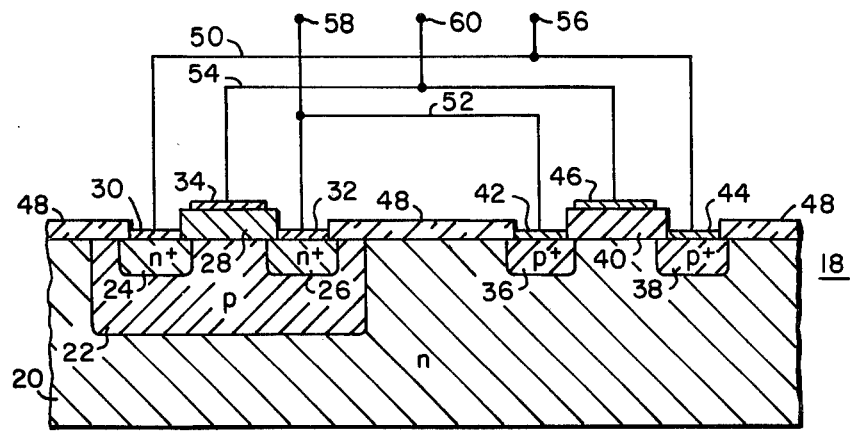
FIG.1
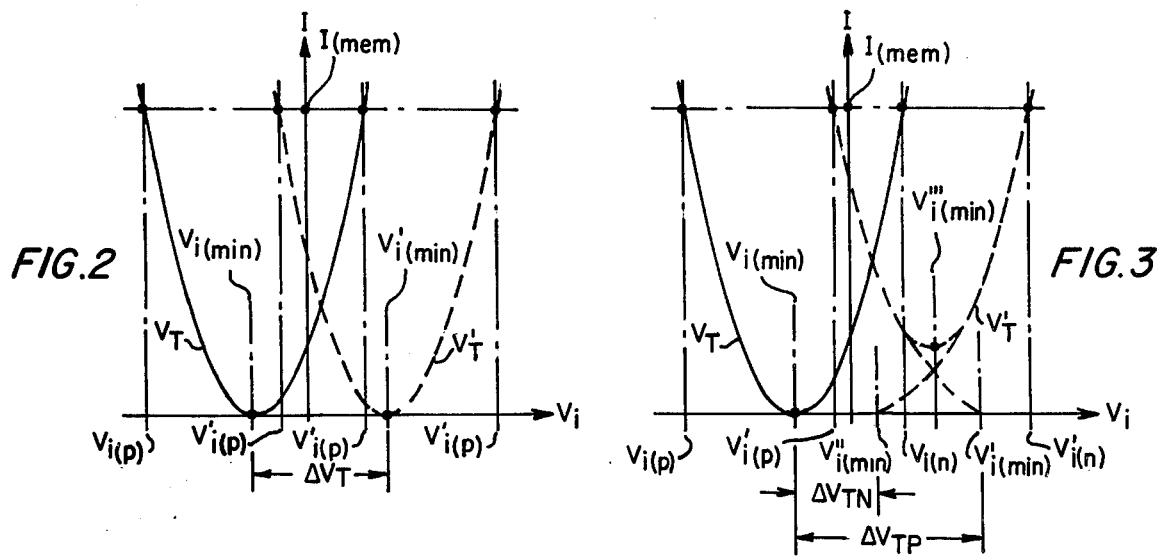
FIG.2
FIG.3
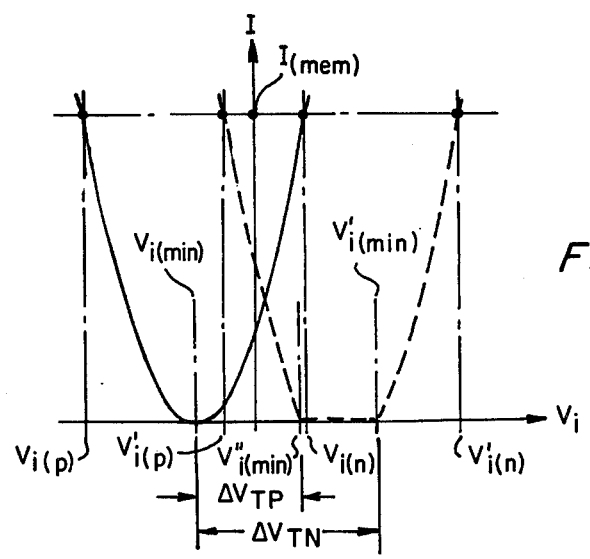
FIG.4

COMPLEMENTARY METAL-FERROELECTRIC SEMICONDUCTOR TRANSISTOR STRUCTURE AND A MATRIX OF SUCH TRANSISTOR STRUCTURE FOR PERFORMING A COMPARISON

BACKGROUND OF THE INVENTION

1. Field of the Invention

The disclosed invention relates to solid state memory elements and to matrix arrangements of such memory elements for performing a comparison function.

2. Description of the Prior Art

Memory elements, that utilize the hysteresis effects observed with certain insulators in field effect transistors are well known in the prior art. The usual form of transistor memory element is an insulated-gate field effect transistor in which the silicon dioxide gate insulator is replaced by a double insulation layer, typically a layer of silicon dioxide near the semiconductor and a layer of silicon nitride over the silicon dioxide. This structure is commonly referred to as a metal-nitride-oxide semiconductor transistor (MNOS transistor). The device is operated as a memory device by controlling the threshold voltage through the application of a polarizing voltage between the gate electrode and the source and drain electrodes for a known time interval. As a result of the polarizing voltage, a charge is formed in the insulator between the gate electrode and the substrate such that a voltage appears between the gate and source electrodes which determines the threshold voltage for the device. The threshold voltage of the memory element is therefore controlled in accordance with the polarizing voltage to establish a memory condition in the element. The memory condition, of threshold voltage, is initialized or erased by applying an erasing voltage of opposite polarity with respect to the polarizing voltage for a predetermined time interval. The hysteresis of MNOS devices is associated with the existence of traps near the silicon dioxide-silicon nitride interface, the threshold voltage of the transistor being influenced by the charged state of the traps as described in U.S. Pat. No. 3,652,324 to Chu et. al. and a publication by J. R. Szedon entitled "An Insulated Gate Field Effect Transistor Non-volatile Memory Element Using Tunnel Trapping In A Diode Layer Dielectric" which appeared in Westinghouse Scientific Report 68-1 F 1-SOISS-RI (1968).

It is also known in the prior art to employ such MNOS memory devices in circuitry so as to perform computations in accordance with the input voltage to output current transfer function of the MNOS memory elements. For example, U.S. Pat. No. 3,864,558 to Ka-Chung Yu describes the control of a memory element comprised complementary connected MNOS devices to compute the square of the deviation of an input signal with respect to a reference signal. In this case, a polarizing voltage is applied to program the memory element by controlling the voltage-current transfer function. After the memory element is programmed, a voltage corresponding to the input signal is applied between the gate and source electrodes of the memory element and the voltage of the input signal provides a saturation drain current corresponding to the square of the deviation between the voltages that represent the reference and input signals. The memory element is erased by applying a voltage of opposite polarity from the polarizing voltage for a sufficient time to return the threshold voltage to its initial value.

Also in the prior art are circuits employing a matrix of memory elements comprised of MNOS devices for comparing a plurality of input signals with a plurality of reference signals such as is described in U.S. Pat. No. 3,845,471 to H. J. P. Reitbeock et al. Briefly, the memory elements of the matrix are selectively programmed either individually or collectively by applying a polarizing voltage for a time corresponding to the various reference signals. The polarizing voltage programs the memory elements by controlling the voltage-current transfer function. The input signals are compared with the respective reference signals by applying voltages corresponding to the input signals in combination with a saturation voltage. The current provided by the memory elements in response to the input signals in the presence of the saturation voltage determines the deviation of the input signal from the reference signal.

The difficulty with the previously described memory elements and matrices of memory elements is that all of these devices or matrices suffer from an electrical instability associated with the thin film semiconducting material of the memory element. That is, the electrical conductivity and the transconductance in either the programmed or non-programmed state of the memory element will drift and decay into an intermediate state over time.

It is also known that ferroelectric materials exhibit a hysteresis effort and such materials have been used to modulate the surface conductivity of semiconductor materials. U.S. Pat No. 2,791,758 to D. H. Looney; U.S. Pat No. 2,791,761 to J. A. Morton; U.S. Pat No. 2,791,759 to W. L. Brown; U.S. Pat No. 2,791,760 to I. M. Hayman and G. H. Hlilmeier, Proceedings of the IEEE, volume 54, number 6 (June, 1966); and "Ceramic Ferroelectric Field Effect Studies" by J. C. Crawford and F. L. English, IEEE Transactions on Electron Devices, volume ed.-16, no. 6 (June, 1969) are believed to be illustrative of the prior art in this respect. One type of these ferroelectric employed a separately grown crystal of guanidinium aluminum sulfate hexahydrate which was placed in contact with the surface of a semiconductor crystal. The air gap between the two surfaces was minimized by various techniques including polishing the surfaces and filling the gap between the surfaces with a dielectric such as ethylene cyanide or nitrobenzene. However, this type of ferroelectric device proved unsatisfactory for many applications due primarily to the poor modulation efficiency of the ferroelectric polarization in combination with a low spontaneous polarization of the guanidinium aluminum sulfate hexahydrate.

As an alternative to forming ferroelectric devices by placing together separately grown ferroelectric and semiconductor crystals, semiconductor films have been deposited by vacuum evaporation on ferroelectric crystals and on ferroelectric ceramic substrates. Generally, these ferroelectric field devices can be divided into categories of an adaptive resistor or an adaptive transistor. The adaptive resistors are fabricated by depositing a semiconducting layer and the adaptive transistors are fabricated by depositing a semiconductive thin film transistor on a ferroelectric crystal or ceramic substrate. Here again, the difficulty with such devices is that they suffer from an electrical instability associated with the thin film semiconducting material. That is, the electrical conductivity and the transconductance in either the programmed or unprogrammed state will drift and decay into an intermediate state with time.

To overcome the problems associated with the thin film semiconducting material, a ferroelectric memory device was developed which utilized the remanent polarization of a ferroelectric thin film to control the surface conductivity of a semiconductor material thereby performing the memory function. The structure of this device is similar to a conventional MOS field effect transistor with the exception that the gate insulating layer is replaced by a layer of an active ferroelectric material. Such a ferroelectric memory device utilizing the remanent polarization of a ferroelectric thin film is described in U.S. Pat. No. 3,832,700. However, this ferroelectric memory device was not compatible with the memory elements used in the matrices employed in the prior art to compare one or more input signals with one or more reference signals.

It remained, therefore, to develop a ferroelectric thin film memory device which would overcome the difficulties and disadvantages of prior art MNOS and ferroelectric memory devices and which was also suitable for use in memory matrices used in the prior art to compare input signals with a reference signal.

SUMMARY OF THE INVENTION

In accordance with the present invention, a memory element includes a complementary pair of metal ferroelectric-semiconductor devices having first and second drain electrodes, first and second source electrodes, and first and second gate electrodes provides a controllable threshold voltage in response to selected voltages. The first drain electrode is electrically connected to the second source electrode, the first source electrode is electrically connected to the second drain electrode, and the first gate electrode is electrically connected to the second gate electrode.

A circuit responsive to an erasing voltage and a polarizing voltage employs the memory element to compare an input signal with a reference signal. In a first switching position the circuit connects the first drain electrode with the first source electrode, the second source electrode with the second drain electrode, and the first and second gate electrodes with the erasing voltage for a known time to initialize the memory element. In a second switching position, the circuit connects the first and second source electrodes and the first and second drain electrodes with a reference signal voltage, and connects the first and second gate electrodes with the polarizing voltage to program the memory element by controlling the threshold voltage of the memory element in response to the reference voltage. In a third switching position the circuit connects the first drain electrode and the second source electrode with a reference potential, the first source electrode and the second drain electrode with a saturation voltage, and the first and second gate electrodes with the input signal to compare the input signal with the reference signal in relation to the drain current of the memory element.

Also in accordance with the present invention, a matrix of memory elements is provided through which a plurality of input signals is compared with one or more reference signals. Means are provided for programming each row of the memory element matrix with one or more reference signals, each reference signal being represented by at least one memory element in the matrix row. Means are also provided for applying one or more input signals to the matrix element columns with each input signal being applied to at least one matrix column such that the drain current of each matrix row corresponds to the deviation of the input signal with respect to the reference signal. Means are also provided for initializing the memory element matrix so that other input and reference signals may subsequently be compared.

DESCRIPTION OF THE DRAWINGS

FIG. 1 illustrates a cross-section of a memory element comprised of a complementary pair of ferroelectric semiconductor devices.

FIG. 2 shows an advantageous voltage-current transfer function for the complementary pair of ferroelectric semiconductor devices of FIG. 1 as used as a memory element.

FIG. 3 shows another voltage-current transfer function for the complementary pair of ferroelectric semiconductor devices of FIG. 1 which would provide poor performance as used as a memory element.

FIG. 4 shows a third voltage-current transfer function for the complementary pair of ferroelectric semiconductor devices of FIG. 1 which would provide poor performance as used as a memory element.

DESCRIPTION OF THE PREFERRED EMBODIMENT

Figure 5:
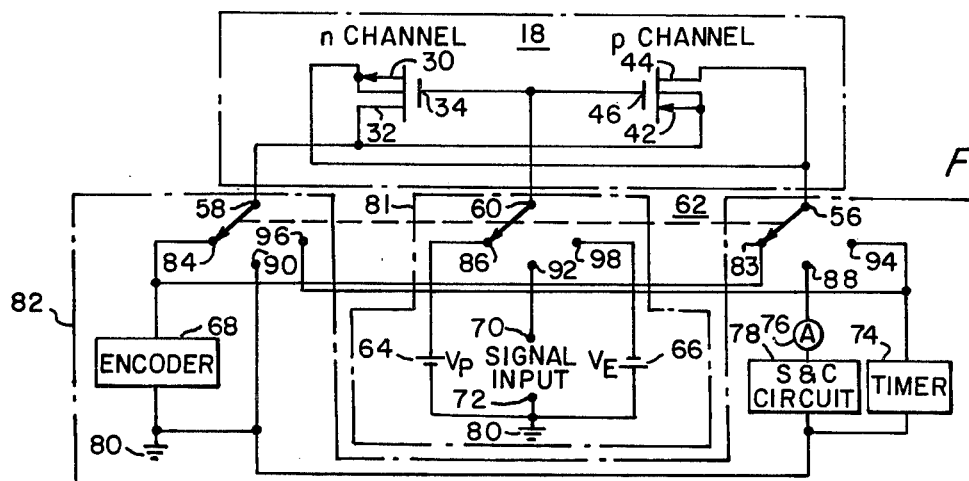
FIG. 5 shows a schematic of the memory element of FIG. 1 as it is included in a typical circuit for comparing an input signal with a reference signal.

FIG. 1 shows a specific example of a complementary pair of metal-ferroelectric-semiconductor transistors (MFST) which, in accordance with the present invention, are used to comprise a memory element. The complementary metal-ferroelectric-semiconductor device of FIG. 1 includes a first semiconductor materal of n-type silicon, a complementary semiconductor material 22 which is diffused into the semiconductor material 20, a first source region 24, a first ferroelectric film 28, and source, drain, and gate electrodes 30, 32, and 34 respectively. The complementary metal-ferroelectric-semiconductor device also includes a second source region 36 in the semiconductor material 20, a second drain region 38, a second ferroelectric film 40, and source, drain, and gate electrodes 42, 44, and 46 respectively. An insulation layer 48 is located on one side of the electrodes 30 and 44 and between the electrodes 32 and 42. The source electrode 30 is connected to the drain electrode 44 by a conductor 50, drain electrode 32 is connected to source electrode 42 by conductor 52, and gate electrode 34 is connected to gate electrode 46 by conductor 54. Conductors 50, 52, and 54 are responsive to signals applied to terminals 56, 58, and 60 respectively.

First semiconductor material 20 is comprised of n-type silicon having selected concentration of a first type of dopant of impurity and complementary semiconductor material 22 is comprised of p-type silicon having a selected concentration of a second type of dopant impurity. Source and drain regions 24 and 26 are comprised of n+-type silicon having a higher concentration of the first type of dopant impurity than first semiconductor material 20, and the source and drain islands 36 and 38 are comprised of p+-type silicon having a higher concentration of the second type of dopant impurity than complementary semiconductor material 22. Ferroelectric films 28 and 40 are typically comprised of bismuth titanate ($Bi_4Ti_3O_{12}$) although other suitable materials may also be used.

In the typical operation of the complementary MFST shown in FIG. 1, when a positive voltage is applied through terminal 60 to conductor 54, a space-charge region or inversion layer is established in the complementary semiconductor 22 in the area between source region 24 and the drain region 26 along the surface of complementary semiconductor 22 adjacent ferroelectric film 28 to form a conducting channel for negative charge carries between source region 24 and drain region 26. At the same time, an accumulation layer is established in semiconductor 20 in the area between the source region 36 and the drain region 38 along the surface of semiconductor 20 adjacent to ferroelectric film 40 such that no conducting channel for positive charge carriers is formed between source region 36 and the drain region 38.

Inversely, when a negative voltage is applied through terminal 60 to conductor 54, a space-charged region or inversion layer is provided in semiconductor material 20 between source region 36 and drain region 38 to provide a channel for positive charge carriers. However, an accumulation layer is then established in complementary semiconductor 22 in the area between source region 24 and the drain region 26 along the surface of complementary semiconductor 22 adjacent to ferroelectric film 28 such that no conducting channel for negative charge carriers is formed between source region 24 and drain region 26, ferroelectric film 28, and gates 30, 32, and 34 comprise an n-channel ferroelectric transistor while semiconductor material 20, source region 36, drain region 38, ferroelectric film 40, and electrodes 42, 44, and 46 comprise a p-channel ferroelectric transistors shown in FIG. 1 is the source-to-drain voltage at which charge flow between the source and drain islands of the respective devices will not further appreciably increase without a change in the voltage applied to the gate electrode. The threshold voltage is the minimum voltage necessary at the gate electrode to provide a current channel between the source and drain electrodes. From the connections of conductors 50, 52, and 54, it is apparent that the difference in drain currents between the n-channel ferroelectric transistor and the p-channel ferroelectric transistor will be the net current flowing at terminal 58. Therefore, the sense of the net current flowing at terminal 58 will determine which of the n-channel or p-channel ferroelectric transistors is conducting more strongly.

The n-channel and p-channel ferroelectric transistors can be biased to a selected threshold voltage by tying the terminals 56 and 58 together and applying a polarizing voltage to the gate electrodes 34 and 46 in combination with a reference voltage to the terminals 56 and 58. The application of the polarizing voltage to the gate terminals 34 and 46 in combination with the reference voltage to the source and drain terminals provides either the ferroelectric film 28 or the ferroelectric film 40 with a remanent polarization, depending on the polarity of the reference voltage. The remanent polarization provides a persisting inversion layer or conducting channel between the source and drain islands of the respective n-channel or p-channel ferroelectric transistors. The degree the remanent polarization, and therefore the strength of the persisting inversion layer is determined by the voltage and the duration of the reference signal. The channel of the other ferroelectric transistor is persistently depleted such that the respective ferroelectric transistor acts as an open switch with no current flowing between the source and drain islands as is described in U.S. Pat. No. 3,823,700 to Shu-Yau Wu et. al. By applying a reference voltage to control the threshold voltage of the complementary connected n-channel and p-channel ferroelectric transistors of FIG. 1, the transistors of FIG. 1 can be programmed as a memory element whose precise threshold voltage is controlled in relation to the reference signal. By then applying an input signal to the gate electrodes 34 and 46 in combination with a saturation voltage across the source and drain electrodes of the complementary connected n-channel and p-channel ferroelectric transistors, the net current between the n-channel transistor and the p-channel transistor which appears at terminal 58 will determine the deviation of the input signal with respect to the reference signal. By reversing the polarity of the polarizing voltage applied to the gate electrodes 34 and 36, the memory element can be initialized for programming in accordance with another reference signal.

Preferably, the complementary MFST as herein disclosed is designed such that the conducting portion of the voltage-current transfer function of the n-channel transistor cooperates with the conducting portion of the voltage-current transfer function of the p-channel transistor to provide a continuous, parabolic voltage-current transfer function for the complementary MFST device that is tangential to the threshold voltage axis. Additionally, the integrity of the voltage-current transfer function is preferably maintained as the transfer function is translated along the threshold voltage axis through the controlled polarization of the ferroelectric films 28 and 40. Therefore, the design of the n-channel portion and the p-channel portion of the complementary MFST device includes consideration of the length of the channel between the source and drain regions, the mobility of the charge carriers, the physical width of the conduction channel, and the capacitance per unit area of ferroelectric films 28 and 40.

FIG. 2 illustrates a typical voltage-current transfer function of the complementary MFST described with respect to FIG. 1 in which the ordinate describes the net drain current of the complementary MFST corresponding to the gate voltage indicated on the abscissa. In FIG. 2, the solid curve $V_T$ illustrates the voltage-current transfer function of the complementary MFST in its initial condition without polarizing the ferroelectric wafers 28 and 40. FIG. 2 shows that a minimum drain current I of zero is provided at a minimum threshold voltage $V_t(min)$. The drain current I provided as the voltage is increased from the minimum current voltage $V_t(min)$ is provided through the n-channel portion of the complementary MFST of FIG. 1. Inversely, the drain current I provided as the gate voltage decreases from $V_t(min)$ is provided through the p-channel portion of the complementary MFST. FIG. 2 shows that, in the design of the complementary MFST, the n-channel portion and the p-channel portion are made to complement each other such that the voltage-current transfer function for the complementary MFST device appears as the continuous parabola shown in FIG. 2 having a minimum value of zero drain current I at the voltage $V_t(min)$.

In accordance with the hysterisis properties that characterize the complementary MFST device described in relation to FIG. 1, the voltage-current transfer function illustrated by the solid line $V_T$ can be translated a predetermined amount along the threshold voltage axis in response to a polarizing voltage applied to the gate electrodes 34 and 46 in combination with a selected voltage applied to the source and drain electrodes 30, 32, 42, and 44 for a predetermined time interval. FIG. 2 shows that the integrity of the parabolic voltage-current transfer function for the complementary MFST device is maintained as the transfer function is translated along the abscissa of FIG. 2 which describes the gate voltage or threshold voltage for the device. This is illustrated in FIG. 2 by the dashed line $V_T'$ in which the minimum current voltage $V_i(\min)$ is translated by an amount $\Delta V_T$ to a value of $V_i'(\min)$. Since the integrity of the parabolic voltage-current transfer function is maintained, the voltages $V_i(n)$ and $V_i(p)$ corresponding to a particular drain current I (mem) are similarly translated by an amount $\Delta V_T$ to values $V_i'(n)$ and $V_i'(p)$ respectively Because, the integrity of the transfer function shown in FIG. 2 is maintained as the transfer function is translated along the threshold voltage axis, the complementary MFST device is useful for determining the threshold voltage applied to the complementary MFST device as a function of drain current for various voltage-current transfer function coordinates determined by the polarizing voltage.

In the design and manufacture of the complementary MFST's shown in FIG. 1, care must be taken such that the integrity of the voltage-current transfer function is maintained through out translations along the threshold voltage axis. For example, FIG. 3 illustrates a case in which in response to a controlled variation in the threshold voltage, the portion of the voltage-current transfer function corresponding to the p-channel portion of the complementary MFST device is translated along the threshold voltage axis a greater amount than the translation of the portion of the voltage-current transfer function corresponding to the n-channel portion of the complementary MFST. Specifically, FIG. 3 shows that, in response to a particular polarizing voltage, the minimum current voltage $V_i(p)$ corresponding to the current I (mem) have been translated by an amount $\Delta V_{TP}$ to the points $V_i'(\min)$ and $V_i'(p)$ respectively. However, in response to the same polarizing voltage, the portion of the transfer function corresponding to the n-channel of the device has been translated by an amount $\Delta V_{TN}$ such that the voltages $V_i(\min)$ and $V_i(n)$ have been translated to values $V_i''(\min)$ and $V_i'(n)$ respectively. The resulting transfer function for the complementary MFST device is illustrated by the dashed lines $V_T'$ as shown in FIG. 3. The minimum current voltage occurs between $V_i'(\min)$ and $V_i''(\min)$ at the point $V_i'''(\min)$. The drain current I corresponding to the minimum current voltage $V_i'''(\min)$ is different that the drain current I corresponding to the minimum current voltage $V_i(\min)$ as a consequence of the deviation in the translation of the voltage-current transfer function corresponding to the n-channel and p-channel portions of the complementary MFST device. The deviation in the minimum drain current I that is inherent in a translation of the voltage-current transfer function of FIG. 3 along the threshold voltage axis will limit the utility of the complementary MFST device in measuring a threshold voltage applied to the device as a function of the drain current for various reference coordinates of the voltage-current transfer function.

FIG. 4 illustrates a situation in which the portion of the voltage-current transfer function corresponding to the n-channel portion of the complementary MFST device is translated a greater amount than the voltage-current transfer function corresponding to the p-channel portion for a given threshold voltage. Specifically, the portion of the transfer function corresponding to the p-channel portion of the device is transferred by an amount $\Delta V_{TP}$ so that the minimum current voltage $V_i(\min)$ is translated to $V_i(\min)$ and the voltage $V_i(p)$ is translated to the voltage $V_i'(p)$. However, the portion of the transfer function corresponding to the n-channel portion of the device is translated by an amount $\Delta V_{TN}$ such that the minimum current voltage $V_i(\min)$ is translated to $V_i'(\min)$ and the voltage of $V_i(n)$ is translated to $V_i'(n)$. As shown in FIG. 4, there exists a range a threshold voltages for the complementary MFST device defined by the limits $V_i'(\min)$ and $V_i''(\min)$ over which the threshold voltage would provide a zero drain current I for the complementary MFST device. Therefore, similarly to the voltage-current transfer function of FIG. 3, the voltage-current transfer function of FIG. 4 does not maintain its integrity as it is translated along threshold voltage axis. Accordingly, a device having the transfer function described with respect to FIG. 4 is of limited utility in measuring the threshold voltage applied to the device as a function of drain current for various reference coordinates of the voltage-current transfer function.

FIG. 5 describes a typical circuit in which the complementary MFST is used as a memory element for comparing an input signal that controls the threshold voltage of the complementary MFST device with respect to a reference voltage which controls the coordinates of the voltage-current transfer function through the polarization of the ferroelectric films. FIG. 5 illustrates schematically the complementary MFST device previously described with respect to FIG. 1. A switch 62 provides a means for switching between first, second and third positions to selectively connect the terminals 56, 58, and 60 to a polarizing voltage, an erasing voltage, a reference signal, and an input signal as is hereafter more fully explained. The particular switch 62 illustrated in FIG. 5 is shown as a three position three pole switch which may be of the electronic type. However, it will be apparent to those skilled in the art that other switching mechanisms could also be used. The polarizing voltage $V_P$ is provided by a polarizing voltage source 64 and the erasing voltage $V_E$ is provided an erasing voltage source 66. The reference signal is provided as the output of an encoder 68 and the input signal is provided in response to the signal applied to the terminals 70 and 72. The encoder 68 provides an output signal having a potential level which corresponds to the reference signal. Also, a timer 74 is provided for controlling the timing of the erasing voltage and an ammeter 76 and a supply and control circuit (S & C circuit) 78 provides a predetermined voltage which is greater than the saturation voltage of the complementary MFST device. For the typical circuit for FIG. 5, voltage sources 64 and 66, encoder 68, input terminals 70 and 72, timer 74, ammeter 76, and S & C circuit 78 are provided with a reference potential 80 which is indicated in FIG. 5 as ground potential. Polarizing voltage source 64, erasing voltage source 66, and terminals 70 and 72 comprise a gate control circuit 81, and encoder 68, reference potential 80, timer 74, S & C circuit 78, and ammeter 76 comprise a drain and source control circuit 82.

In the operation of the circuit shown in FIG. 5, assuming that the complementary MFST device 18 comprising the memory element is in an initial state, switch 62 is in a first position in which terminals 56, 58, and 60 are connected to terminals 83, 84, and 86 respectively such that the polarizing voltage ($V_P$) is applied to the gate electrodes 34 and 46 and the reference voltage is provided by the encoder 68 to source and drain terminals 30, 32, 42, and 44. The reference voltage provided by encoder 68 in combination with the polarizing voltage $V_P$ provided by polarizing voltage source 64 is such that the voltage-current transfer function of the complementary MFST 18 is translated from the initial position illustrated in FIG. 2 by the solid line $V_T$ to the position illustrated by the dashed line $V_T'$ in accordance with the hysteresis character of the complementary MFST device 18. The voltage-current transfer function is thereby translated by an amount $\Delta V_T$ that corresponds to the reference signal provided by the encoder 68. Accordingly, the duration of the output of the encoder 68 is such that the appropriate $\Delta V_T$ shift in the voltage-current transfer function will be achieved. By so shifting the voltage-current transfer function of the complementary MFST, the device is programmed to remember or store the value of the reference signal for subsequent comparison with an input signal that is applied as a threshold voltage to the complementary MFST device 18.

After the reference signal has been stored by polarizing the MFST device 18 to translate the voltage-current transfer function an amount corresponding to the value of the reference signal, switch 62 is shifted to the second position in which the terminals 56, 58, and 60 are connected to terminals 88, 90, and 92 respectively. When switch 62 is in this second position, the input signal is provided from terminals 70 and 72 to the gate electrodes 34 and 46; the drain electrode 32 and the source electrode 42 are connected to ground potential 80; and the source electrode 30 and the drain electrode 44 are connected to the saturation voltage provided by S & C circuit 78. When switch 62 is in this second position and the input signal is applied between terminals 70 and 72, ammeter 76 determines the value of the input signal with respect to the reference signal by measuring the magnitude and sense of the net drain current flowing through the complementary MFST device 18. More specifically, as illustrated in FIG. 2, with the voltage-current transfer function shifted to the position illustrated by dashed line $V_T'$, if the input signal is equal the reference signal, the voltage $V_i'$ (min) is applied to the gate terminals 34 and 46 such that the net drain current for the complementary MFST device is zero. If the output signal is greater than the reference signal, the voltage applied to the gate terminals 34 and 46 is greater than $V_i'$ (min) and the net drain current provided by the complementary MFST device 18 will increase along the portion of the voltage-current transfer function corresponding to the n-channel portion of the complementary MFST device. Similarly, if the input signal is less than the reference signal, the voltage applied to the gate terminals 34 and 46 is less than the voltage $V_i'$ (min) and the current will increase along the portion of the voltage-current transfer function corresponding to the p-channel portion of the complementary MFST device 18.

Additional signals may then be compared with the reference signal by applying these additional input signals to the terminals 70 and 72 and measuring the net drain current flowing through the ammeter 76. However, if the input signals are to be compared to a different reference signal, the memory device comprised of the complementary MFST 18 must first be initialized prior to reprogramming the device with the next reference signal. This initialization operation is provided by placing the switch 62 in its third position in which the terminals 56, 58, and 60 are connected to terminals 94, 96, and 98 respectively. In this third position, the erasing voltage $V_E$ of erasing voltage source 66 is provided to the gate electrodes 34 and 46 and the source and drain electrodes 30, 32, 42, and 44 are connected to ground potential 80 through timer 74. As illustrated in FIG. 5, the polarity of the erasing voltage source 66 is of an opposite sense from the polarizing voltage 64 such that the voltage-current transfer function of the complementary MFST device 18 is translated along the threshold voltage axis back to its initial position illustrated in FIG. 2 by the solid line $V_T$. The time interval provided by the timer 74 is sufficient to drive the ferroelectric films 28 and 40 into the knee of their hysteresis curve such that, when the time period expires and the erasing voltage $V_E$ is removed, the n-channel and p-channel portions of the complementary MFST device 18 are returned to their initial conditions. After complementary MFST device 18 has been initialized in this manner, it may then be reprogrammed with another reference signal and this reference signal compared with subsequent input signals in accordance with the manner previously described.

Figure 6:
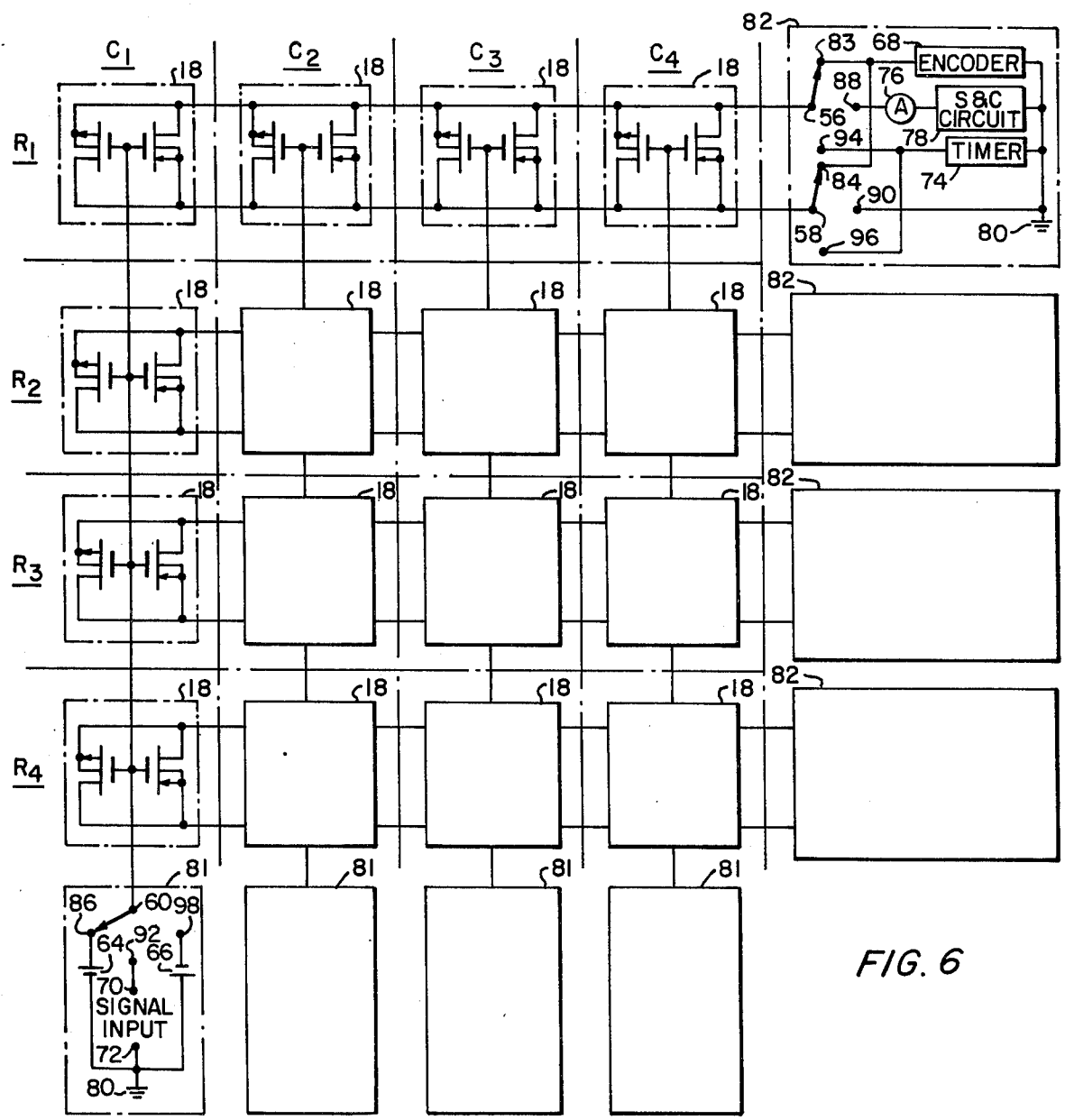
FIG. 6 shows an array of the memory elements in FIG. 1 arranged in rows and columns for comparing one or more input signals with one or more reference signals.

The complementary MFST device 18 can also be arranged in a matrix of rows and columns of memory elements in which each of the memory elements are comprised of an MFST device 18 that is controlled in a manner analogous to that previously explained in respect to FIG. 5. Such a matrix of memory elements provides for the simultaneous comparison of a plurality of input signals with respect to one or more reference signals. FIG. 6 illustrates a four-by-four matrix of memory elements arranged in rows $R_1$ through $R_4$ and columns $C_1$ through $C_4$. For purposes of the present description, each memory element (M) in the matrix is identified by row and column through the use of a two digit subscript to the letter in which the first digit indicates the row and the second digit indicates the column. For example, the memory element located in the second row ($R_2$) and the fourth column ($C_4$) is identified as $M_{24}$. Similarly, the memory element in the third row $R_3$ and the first column is identified as $M_{31}$. Each of the memory elements in the matrix of FIG. 6 is controlled in response to gate control circuit 81 and drain and source control circuit 82 as was explained with respect to the single memory element of FIG. 5. Accordingly, the operation of each memory element in the matrix can be described in accordance with the description of the operation of the memory element of FIG. 5.

Each memory element in the matrix of FIG. 6 can be programmed by controlling the signals applied to the gate terminals in relation to the signals applied to the source and drain terminals. Therefore, each memory element of the matrix is controlled by coordinating the signals applied by the source and drain control circuit 82 for the matrix row of the memory element with respect to the application of the signals provided by the gate control circuit 82 for the matrix row of the memory element with respect to the application of the signals provided by the gate control circuit 81 to gate electrodes in the matrix column of the memory element. For example, the memory element in column 1 of row 1 is programmed in accordance with the description of FIG. 5 by controlling the voltages applied to the source and drain terminals in row 1 in relation to the voltages applied to the gate terminals in column 1. As another example, the memory element in column 2 of row 3 is programmed by appropriately controlling the voltages applied to the source and drain electrodes of the third row in relation to the voltages applied to the gate electrodes in the second column.

By successively programming one or more memory elements in a selected row of the memory element matrix, a reference signal is stored in each programmed memory element such that a simultaneous comparison of an input signal with a reference signal can be made for each programmed element in the matrix row. The simultaneous comparison may be between one input signal and a plurality of reference signals. For example, if all of the memory elements $M_{11}$-$M_{14}$ in the first row $R_1$ of the matrix are selectively programmed with different reference signals, an input signal will be simultaneously compared with these reference signals by applying the input signal to the gate electrodes of each matrix column when the terminals 56 and 58 are connected to the terminals 88 and 90 respectively and measuring the net drain current through ammeter 76.

The simultaneous comparison may also be between a plurality of reference signals and a plurality of input signals. For example, if the memory elements $M_{21}$ and $M_{23}$ are programmed in response to first and second reference signals, first and second input signals $S_1$ and $S_2$ can be simultaneously compared with the first and second reference signals respectively by applying the input signals $S_1$ and $S_2$ to the gate electrodes of memory elements in column 1 and 3 respectively and measuring the net drain current through the ammeter included in the drain and source control circuit 82 of row 2. Similarly, as will be readily apparent to one skilled in the art, the matrix may also be employed to simultaneously compare a single reference signal with one or more input signals.

FIG. 6 further illustrates that a simultaneous comparison may be made between one or more input signals with respect to one or more combinations of reference signals. The input signals can be simultaneously compared with more than one combination of reference signals by programming additional rows of the memory element matrix with the reference signal combinations against which the comparison is to be made. That is, the matrix rows $R_1$-$R_4$ can be programmed with four combinations of reference signals in accordance with the selective programming of each memory element in the matrix as previously described. Up to four input signals are then applied to the matrix columns $C_1$-$C_4$ and the simultaneous comparison of the input signals with each combination of reference signals stored in the respective matrix row is then determined in relation to the net drain current for the matrix row as measured by the ammeters of the respective drain and source control circuit 82. As an example, consider one combination of reference signals as being programmed in the elements $M_{11}$ and $M_{14}$ of the matrix row $R_1$ and a second combination of reference signals programmed in the elements $M_{31}$ and $M_{34}$ of matrix row $R_3$. Input signals $S_1$ and $S_4$ are then simultaneously provided to matrix columns $C_1$ and $C_4$ to simultaneously compare the input signals with both of the combinations of reference signals stored in rows $R_1$ and $R_3$. The comparison of the input signals with each of the combinations of reference signals stored in $R_1$ and $R_3$ is made by reference to the respective ammeters of the drain and source control circuit 82 which measure the net drain current for the matrix rows $R_1$ and $R_3$. Additional input signals can subsequently be applied either singly or in combination to the matrix columns to compare these input signals with the plurality of combinations of reference signals programmed in the matrix rows.

In accordance with the foregoing description of the preferred embodiment, there has been described a complementary MFST device that is useful as a memory element. The memory element comprised of the MFST device, which can be used either singularly or in a matrix of memory elements, affords faster response times and/or lower power requirements than memory elements of the prior art, including MNOS type memory elements. Furthermore, the complementary MFST device provides a memory element with improved time invariance, retentivity, and a broader operating range for a non-volatile memory element.

I Claim:

1. A complementary metal-ferroelectric-semiconductor device that provides a controllable minimum current in response to selected voltages, said semiconductor device comprising:

a first semiconductor material having a first type of dopant impurity;

a semiconductor material located in the first semiconductor material, said complementary semiconductor material comprised of a second type of dopant impurity;

a first source region in said complementary semiconductor material, said first source region having a concentration of the first type of dopant impurity that is higher than the concentration of said first type of dopant impurity in the semiconductor substrate;

a first drain region in said complementary semiconductor material, said first drain region having a higher concentration of the first type of dopant impurity than the first semiconductor material, said first drain region being displaced from said first source region by a predetermined lateral distance across the surface of the complementary semiconductor material;

a first ferroelectric film adjoining the complementary semiconductor material along the predetermined lateral distance between said first source region and said first drain region;

first source and drain electrodes covering the surface of the first source and first drain regions respectively and a first gate electrode covering the surface of said ferroelectric film that is oppositely disposed from the surface of the ferroelectric film adjoining the complementary semiconductor material;

a second source region in said first semiconductor material, said second source region having a higher concentration of the second type dopant impurity than the concentration of said complementary semiconductor material;

a second drain region in said first semiconductor material, said second drain region having a higher concentration of the second type of dopant impurity than the concentration of said complementary semiconductor, said second drain region being disposed from said source retion by a predetermined lateral distance across the surface of the first semiconductor material;

a second ferroelectric film adjoining the first semiconductor material along the predetermined lateral distance between said second source region and said second drain region; and second source and drain electrodes covering the surface of the second source and the second drain regions respectively, and a second gate electrode covering the surface of said second ferroelectric film that is oppositely disposed from the surface of the ferroelectric film adjoining the first semiconductor material, the first drain and source electrodes being respectively connected to the second source and drain electrodes, and the first gate electrode being connected to the second gate electrode such that the first and second electrodes are connected in complementary fashion.

2. The semiconductor device of claim 1 wherein said complementary semiconductor material is comprised of a p-type material and wherein said first semiconductor material is comprised of an n-type material.

3. The semiconductor device of claim 2 wherein said first source region is comprised on $n^+$-type material, said second source region is comprised of $p^+$-type material, said first drain region is comprised of $n^+$-type material, and said second drain region is comprised of $p^+$-type material.

4. A circuit responsive to an erasing voltage and a polarizing voltage, to compare an input signal with a reference signal, said circuit comprising:

a complementary pair of ferroelectric semiconductor devices, having first and second drain electrodes, first and second source electrodes, and first and second gate electrodes, the first drain electrode being electrically coupled to the second source electrode, the first source electrode being electrically coupled to the second drain electrode, and the first gate electrode being electrically coupled to the second gate electrode; and means for selectively switching between first, second and third states; the first state of said switching means connecting the first drain electrode with the first source electrode, the second source electrode with the second drain electrode, and the first and second gate electrode with the erasing voltage for a known time to initialize the complementary pair of ferroelectric devices; the second state of said switching means connecting the first and second source electrodes and the first and second source electrodes and the first and second drain electrodes with a reference signal voltage, and connecting the first and second gate electrodes with the polarizing voltage to control the threshold voltage of the complementary pair of semiconductor devices in response to the reference voltage; and the third state of said switching means connecting the first drain electrode and the second source electrode with a reference potential, connecting the first source electrode and the second drain electrode with a saturation voltage, and connecting the first and second gate electrodes with the input signal to compare the input signal with the reference signal with respect to the drain current of said complementary pair of ferroelectric semiconductor devices.

5. A circuit responsive to an erasing voltage, a polarizing voltage, an input signal and a reference signal to compare the input signal with the reference signal, said circuit comprising:

an n-channel metal-ferroelectric-semiconductor transistor having a source electrode, a drain electrode, and a gate electrode;

a p-channel metal-ferroelectric-semiconductor transistor having a source electrode, a drain electrode, and a gate electrode, said p-channel transistor being connected to said n-channel transistor in complementary relationship such that the drain electrode of said n-channel transistor is connected to the source electrode of said p-channel transistor, the source electrode of said p-channel transistor, and the gate electrode of said n-channel transistor is connected to the gate electrode of said p-channel transistor;

a switching means for selectively connecting the source, drain, and gate electrodes of said n-channel and said p-channel transistors to the input and reference signals, the poling voltage, and the erasing voltage such that, when the switching means is in a first state, the n-channel drain electrode is connected with the n-channel source electrode, the p-channel source electrode is connected with the p-channel drain electrode, and the n-channel and p-channel gate electrodes are connected with the erasing voltage to initialize the complementary pair of ferroelectric transistors; when the switching means is in a second state, the n-channel source electrode, the n-channel drain electrode, the p-channel source electrode, and the p-channel drain electrode are connected with the reference signal, and the n-channel and p-channel gate electrodes are connected with the polarizing voltage to control the threshold voltage of the complementary pair of ferroelectric transistors in response to the reference signal; and, when switching means is in a third state, the n-channel drain electrode and the p-channel source electrode are connected with a reference potential, the n-channel source electrode and the p-channel drain electrode are connected with a saturation voltage, and the n-channel and p-channel gate electrodes are connected with the input signal to compare with input signal with the reference signal with respect to the drain current of said complementary pair of ferroelectric transistors.

6. A circuit for comparing at least one input signal having a plurality of parameters with at least one reference signal having a plurality of parameters, said circuit comprising:

a matrix of memory elements, each of said memory elements including a p-channel ferroelectric transistor having drain, source, and gate electrodes and an n-channel ferroelectric transistor having drain, source and gate electrodes where said n-channel ferroelectric transistor is complementarily connected to said p-channel ferroelectric transistor is complementarily connected to p-channel ferroelectric transistor;

means for programming the ferroelectric transistors of each of the memory elements by applying a polarizing signal in combination with the reference signal for a selected interval such that the threshold voltage of the transistors corresponds to the voltage and duration of the reference signal;

means for applying the input signal in combination with a saturation voltage to each of said memory elements such that the output of the memory elements corresponds to the deviation of the input signal with respect to the reference signal; and means for erasing the programming of the memory elements provided by said programming means.

7. A signal recognition circuit for comparing input signals having a plurality of parameters with a reference signal having a plurality of parameters, said circuit comprising:

a matrix of memory elements arranged in a predetermined number of columns and rows, each of said memory elements including an n-channel ferroelectric transistor and a p-channel ferroelectric transistor, said n-channel and p-channel transistors having drain, source, and gate electrodes that are complementarily connected;

means for programming at least one memory element in a selected row of said matrix with a parameter of the reference signal by applying a voltage corresponding to the reference signal parameter to the drain and source electrodes of the n-channel and p-channel transistors of the selected matrix row in combination with the application of a polarizing voltage to the gate electrodes of the n-channel and p-channel transistors of the memory elements in a selected column of said matrix that includes said one memory element;

means for comparing the parameter of the reference signal with the parameter of the input signal by applying a voltage corresponding to the input signal parameter to the gate electrodes of the memory element in the selected matrix column in combination with the application of a saturation voltage to the source and drain electrodes of the memory elements in the selected matrix row; and means for erasing the programming of the memory element in both the selected matrix row and the selected matrix column by applying an erasing voltage to the gate electrodes of the memory elements in the selected matrix column in combination with a signal provided to the source and drain electrodes of the memory elements in the selected matrix row.

8. The apparatus of claim 7 wherein said programming means controls the voltage-to-current transfer function of memory element to store the parameter of said first signal.

9. The apparatus of claim 8 further comprising:

means for evaluating the comparison between the parameters of said reference and input signals to determine the deviation between the parameters of said reference and input signals.

10. The apparatus of claim 8 wherein said comparing means provides an output current corresponding to the comparison of said reference and input signals in the memory elements of a matrix row.

11. The apparatus of claim 10 further comprising:

means for evaluating the comparison between the parameters of said reference and input signals, said evaluating means being responsive to the output of said comparing means to determine the output current of said comparing means.

12. The apparatus of claim 7 wherein said comparing means provided the saturation voltage to the source electrode of each n-channel transistor, and to the drain electrode of each p-channel transistor for each memory element in the selected matrix row.

13. Apparatus for classifying an electrical signal having n characteritics from among n categories of electrical signals comprising:

A. a learning matrix of n columns and m rows having a MFST memory circuit at each location of the matrix, each said MFST memory circuit comprising complementary n-channel and p-channel MFST with each MFST having a source, drain and gate each electrically connected in common with drain, source and gate of the other MFST, respectively;

B. M read means electrically connected in parallel to the drains of the MFST memory circuits of each row for measuring combined drain currents of the MFST memory circuits of said row;

C. N learning means electrically connected in parallel to the gates of the MFST memory circuits of each column for applying an instruction voltage corresponding to one of n characteristics of a comparison characteristic of one of the n categories;

D. n input means electrically connected in parallel to the electrical connections of the MFST memory circuits of each column for applying a voltage corresponding to one of n electrical characteristics of an electrical signal to be classified to the electrical connections of the said column; and E. evaluator means electrically connected to said m read means for comparing the electrical outputs of the read means of rows of the MFST memory circuits of the learning matrix and identifying the read means for the row of MFST memory circuit with categorizing m struction voltages most clearly matched to the electrical signal to be classified.

* * * * *